United States Patent [19]
Lee

[11] Patent Number: 4,990,800
[45] Date of Patent: Feb. 5, 1991

[54] MODE SELECTOR FOR USE IN SEMICONDUCTOR MEMORY DEVICE

[75] Inventor: Dong-Jae Lee, Seoul, Rep. of Korea

[73] Assignee: SamSung Electronics Co., Ltd., Suweon, Japan

[21] Appl. No.: 292,353

[22] Filed: Dec. 30, 1988

[30] Foreign Application Priority Data

Dec. 30, 1987 [KR] Rep. of Korea ............... 1987-15350

[51] Int. Cl.$^5$ .................................... H03K 17/687
[52] U.S. Cl. .................................. 307/465; 307/451; 307/469
[58] Field of Search .................. 307/451–452, 307/465, 468, 469, 481, 592, 594; 365/189.03, 189.04

[56] References Cited

U.S. PATENT DOCUMENTS

| | | | |
|---|---|---|---|
| 4,612,459 | 9/1986 | Pollachek | 307/468 |
| 4,697,095 | 9/1987 | Fujii | 307/465 X |
| 4,721,868 | 1/1988 | Cornell et al. | 307/465 |
| 4,763,303 | 8/1988 | Flannagan | 365/189 |
| 4,783,606 | 11/1988 | Goetting | 307/592 X |
| 4,808,844 | 2/1989 | Ozaki et al. | 307/465 X |
| 4,825,414 | 4/1989 | Kawata | 365/189 |
| 4,835,414 | 5/1989 | Freidin | 307/465 X |

*Primary Examiner*—David Hudspeth
*Attorney, Agent, or Firm*—Robert E. Bushnell

[57] ABSTRACT

A mode selecting circuit for selecting a single operational mode in a semiconductor memory device having a plurality of operational modes. Instead of using an additional masking process, the present invention uses mode selecting pads, wherein a mode selecting pad is bonded to the terminal of the power source so as to select a mode in the final assemblying stage of the manufacturing process, so that the process is simplified and the yield rate is increased.

20 Claims, 2 Drawing Sheets

4,990,800

MODE SELECTOR FOR USE IN SEMICONDUCTOR MEMORY DEVICE

BACKGROUND OF THE INVENTION

The present invention relates to a semiconductor memory device and more particularly a mode selecting circuit for selecting mode of operation of the semiconductor memory device.

A semiconductor memory device is often manufactured so as to perform a special mode of operation to increase its performance. The Dynamic Random Access Memory (DRAM) is manufactured so as to function optionally through one of the various special modes to improve its read/write performance such as fast page mode, static column mode and nibble mode. Conventionally, a particular operational mode is determined by connecting a metal line with the logic circuit for enabling a selected mode through adding a metal masking process during the manufacturing process. Consequently, the metal masking process requires a different masking process, for each operation mode each different masking process, which further requires each different masking layer. If the number of the masking processes and masking layers is increased, not only the production cost is increased, but also problems inherent in the process occur.

SUMMARY OF THE INVENTION

It is an object of the present invention to provide a mode selecting circuit for selecting a single mode of a plurality of operational modes with the simplified design and manufacturing process in a memory device having a plurality of operational modes.

It is another object of the present invention to provide a mode selecting circuit comprising a control clock generator which employs as small of a number of elements and as small of an area as possible.

In order to accomplish the above objects, the present invention provides a circuit for selecting an operational mode of a semiconductor memory in which data may be stored and from which the same data may be retrieved, including a first voltage supplying terminal for receiving the voltage of a power source, a second voltage supplying terminal for receiving the ground voltage, an input terminal for inputting the same voltage as the voltage of said power source after a certain time has passed since supplying said first voltage supplying terminal with the voltage of said power source, a mode selecting pad for supplying a certain amount of voltage, an output terminal, a first node, a second node, a third node, a first inverter for inverting the input signal, said first inverter being connected between the input terminal and the first node, a first switching stage for responding to the input signal of the first node and establishing a conducting channel between the second voltage supplying terminal and the second node, a second switching stage for responding to the input signal of the mode selecting pad and establishing a conducting channel between the second voltage supplying terminal and the third node, a latch for latching a certain voltage state according to the switching of the first switching stage and the second switching stage, the latch being connected between the second and third nodes, an insulating gate field effect transistor having a channel connected between the mode selecting pad and said second voltage supplying terminal and a gate connected with the third node, and a second inverter for inverting the voltage state of the third node, the second inverter being connected between the output terminal and the third node.

DETAILED DESCRIPTION OF A PREFERRED EMBODIMENT OF THE INVENTION

Figure 1:
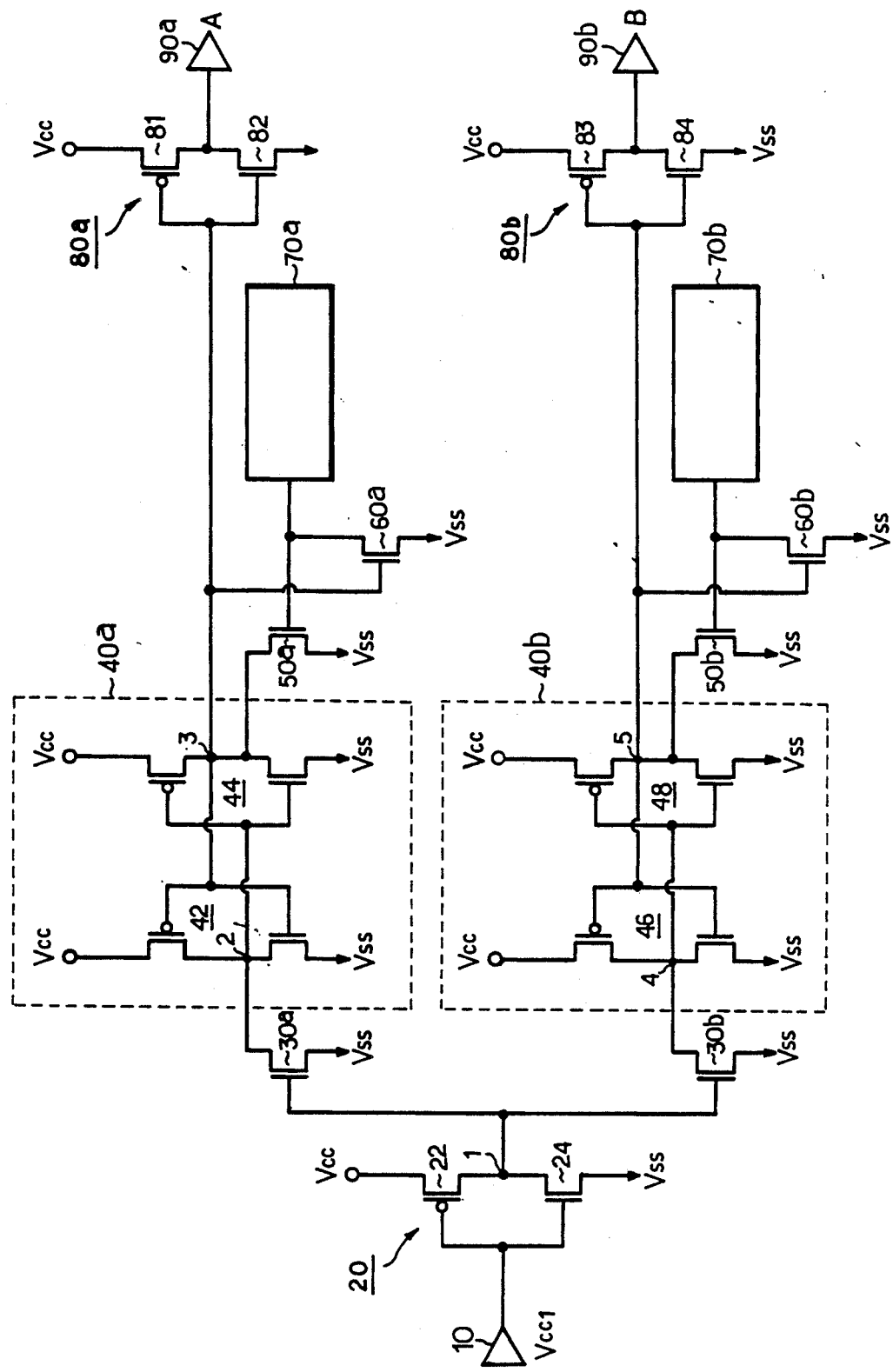
FIG. 1 is a schematic circuit diagram of a preferred embodiment of a control clock generator according to the present invention.

The present invention will now be described with reference to the drawings attached only by way of example. Referring to FIG. 1, the circuit shows a preferred embodiment of a circuit for generating control clock pulses of the present invention, which may be used to select an operation mode of a memory device having two selecting modes together with a basic mode. Between input terminal 10 and first node 1 is connected CMOS inverter 20 consisting of PMOS field effect transistor 22 (hereinafter referred to as PMOS) and NMOS field effect transistor 22 (hereinafter referred to as NMOS). First switching transistors 30a and 30b consist of NMOSs whose channels are connected between second nodes 2 and 4 and a second supply voltage terminal Vss, and whose gates are connected with the first node 1. If the input signal is LOW, the first node becomes HIGH, which triggers ON first switching transistors 30a and 30b, and thereby makes latching circuits 40a and 40b be latched into HIGH state. Latching circuits 40a and 40b each consist of two CMOS inverters (42 and 44; 46 and 48). Second nodes 2 and 4, and third nodes 3 and 5 come to have a different logic states from each other. The state of third nodes 3 and 5 are to affect the output. Second switching transistors 50a and 50b each consist of a NMOS transistor with channels whose channel is connected between the third node and the second voltage supplying terminal, and with gates connected with mode selecting pad 70a, 70b respectively. When the mode selecting pad receives the HIGH state voltage, latching circuits 40a, 40b come to latch into LOW state. NMOS transistors 60a and 60b with channels is connected between mode selecting pad 70a, 70b and second voltage supplying terminal Vss, and with gates connected with the third node, are to assure that second switching transistors 50a, 50b are kept in an OFF state; second switching transistors 50a, 50b go to a floating state when the HIGH signal is not applied to the mode selecting pad because of the mode selecting pad being not selected. Between third nodes 3, 5 and output terminals 90a, 90b are connected CMOS inverters 80a, 80b consisting of PMOS transistors 81, 83 and NMOS 82, 84. Although a CMOS inverter 20 is commonly connected with two circuits for generating control clock pulses to select a mode as shown in FIG. 1, it will be appreciated by those skilled in the art that each separate circuit for generating control clock pulses may be employed to select a single operational mode.

According to the present invention, the mode selecting pads and the control clock generators may be as many as the number of the selecting modes in the memory device to achieve each selection of mode therein. If one of the three modes of fast page mode, static column mode and nibble mode is selected, there are selectively provided a single basic mode and two selecting modes, which require two mode selecting pads and each circuit for generating control signals for each pad, as shown in FIG. 1. If a voltage for operating the second switching transistor is applied to each of the mode selecting pads, the circuit for generating control signals which is connected with the pad receiving the voltage, generates control signals. Therefore, two mode selecting pads are used to select two modes.

Figure 2:
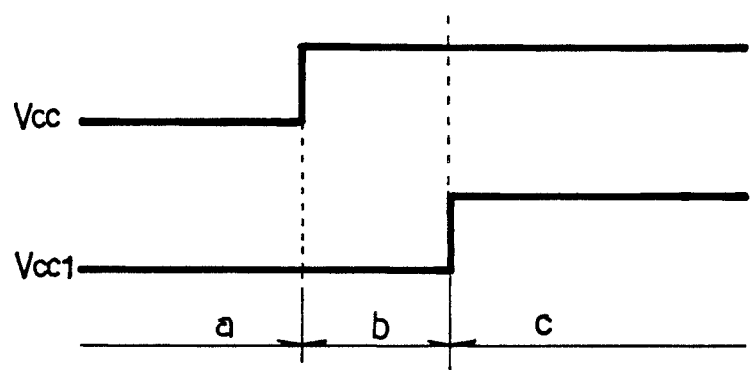
FIG. 2 is a waveform diagram for showing the timing of source supply voltages applied to the control clock generator.

First, the case of selecting the basic mode is described with reference to FIGS. 1 and 2. Referring to FIG. 2, Vcc represents the voltage of a power source applied to the first voltage supplying terminal, and Vcc1 the input voltage applied to the input terminal which is obtained by delaying the voltage of the power source for a certain time. If the basic mode is selected, mode selecting pads 70a and 70b of the first and second circuits for generating control clock pulses are not selected. Therefore, second switching transistors 50a and 50b are in the floating state, so that the outputs from output terminals 90a and 90b are controlled only by the input voltage Vcc1. Vcc1 is in LOW state in a the interval b in FIG. 2 so that first node 1 which is the output node of CMOS inverter 20 is in a HIGH state. The output of the node 1 turns ON first switching transistors 30a and 30b, thereby causing second nodes 2 and 4 to be in the LOW state.

The LOW state signal applied to second nodes 2 and 4 makes the third nodes 3 and 5 which are the output nodes of CMOS inverters 80a and 80b change into a HIGH state. The outputs of third nodes 3 and 5 cause CMOS inverters 80a and 80b to be in the LOW state, so that a control clock of operation mode supplied from output terminals 90a and 90b is in the LOW state, thereby disabling the circuit for generating control clock pulses. If Vcc1 goes to a in the HIGH state after a certain time has lapsed, first node 1 goes to a LOW state, and then first switching transistors 30a and 30b keep the floating state. However, latching circuits 40a and 40b consisting of two CMOS inverters make the output of the first switching transistors keep in the LOW state. Insulating gate field effect transistors 60a and 60b are turned ON by the HIGH state once latched onto the latching circuits, and completely turn OFF second switching transistors 50a and 50b. In this way, the basic mode can be performed.

The operation for selecting another mode ('A' mode) will now be described with reference to FIGS. 1 and 2. In order to select A mode, mode selecting pad 70a is bonded to the Vcc supplying voltage terminal, and mode selecting pad 70b not bonded. In interval b as shown in FIG. 2, the state of third node 3 is determined by the ratio between CMOS inverter latches 44 and 42. However, in interval c that the input voltage Vcc1 goes to in the HIGH state, first node 1 goes to a LOW state, causing first switching transistor 30a to be in the floating state so that the circuit works according to the input voltage of mode selecting pad 70a. Consequently, second switching transistor 50a is turned ON, thereby causing third node 3 to be at ground level so that output terminal 90a outputs the HIGH state. Namely, the control clock for selecting A mode is enabled. However as, mode selecting pad 70b in the second circuit for generating control clock pulses is not bonded to the terminal of the power source, second switching transistor 50b is in the floating state. Further, the input voltage Vcc1 is in the LOW state in interval b of FIG. 2, and therefore, first node 1 is in the HIGH state. Second node 4 is in the LOW state, since first switching transistor 30b is turned ON.

Consequently, the output of latching circuit 40b is in the HIGH state, and the final output from output terminal 90b goes to in the LOW state. The operation of the second circuit for generating control clock pulses will be the same as that of selecting the basic mode. Conclusively, in the case of selecting mode A, the A clock from output terminal 90a is in the HIGH state, while the B clock from output terminal 90b is in the LOW state. Thus, all the modes of the chip are controlled.

Alternatively, in the case of selecting the other mode ('B' mode), mode selecting pad 70b of the second circuit for generating control clock pulses is only bonded to the terminal of the power source conversely to the case of selecting mode A. Therefore, the A clock from output terminal 90a of the first circuit for generating control clock pulses is in the LOW state, while the B clock from output terminal 90b of the second circuit for generating control clock pulses is in the HIGH state. Thus, all the modes of the chip are controlled.

As described above, the present invention selects a mode by selective bonding so that an additional mask accompanying selection of a mode by a metal mask need not be used, thereby resulting in the reduction of production cost. Additionally, according to the present invention, one of the mode selecting pads is bonded to the terminal of the power source so as to select a mode in the final assemblying stage of the process, so that the process is simplified and the yield rate is increased. Furthermore, the present invention carries out selection of a mode by the voltage of the power source and the input voltage obtained by delaying the voltage of the power source for a certain time, and uses mininum transistors and minimum area, thereby increasing its usefulness. Also, since each mode requires only a separate pad and a circuit for generating control clock pulses, the construction of logic is simplified.

While the invention has been particularly shown and described with reference to a preferred embodiment, it will be understood by those skilled in the art that modifications in detail may be made without departing from the spirit and scope of the invention.

What is claimed is:

1. A mode selecting circuit for selecting a single operational mode in a semiconductor memory device having a plurality of operation modes, comprising:
   a first voltage supplying terminal for receiving a source supply voltage;
   a second voltage supplying terminal for receiving a ground reference potential;
   an input terminal for receiving as an input signal the voltage of said source supply delayed by a specified time;
   a mode selecting pad to which a mode selection signal may be supplied;
   an output terminal;
   a first node;
   a second node;
   a third node;
   first inverting means for providing a first inverted signal by inverting the input signal, said first inverting means being connected between said input terminal and said first node;
   first switching means responding to the first inverted signal of said first node, for providing a conducting channel between said second voltage supplying terminal and said second node;

second switching means responding to the mode selection signal of said mode selecting pad for providing a conducting channel between said second voltage supplying terminal and said third node;

latching means connected between said second and third nodes, for latching a voltage state according to switching of said first switching means and said second switching means;

an insulating gate field effect transistor having a channel connected between said mode selecting pad and said second voltage supplying terminal, and a gate connected with said third node; and second inverting means connected between said output terminal and said third node, for inverting the voltage state of said third node.

2. A circuit of claim 1, wherein said mode selecting pad is selectively coupled to the terminal of said source supply to select an operational mode.

3. A circuit of claim 1, wherein said latching means comprises a pair of cross-connected CMOS inverting gates whose input and output are cross-connected with each other.

4. A mode selecting circuit, comprising:
an input terminal for receiving as an input signal a voltage of a source supply delayed by a time interval;
a mode selecting pad for receiving a mode selection signal;
first inverting means for providing a first inverted signal by inverting an input signal, said first inverting means being connected between said input terminal and a first node;
first switching means responding to the first inverted signal at said first node, for providing a conducting channel between a second voltage supplying terminal and a second node, and an intermediate signal exhibiting binary state at said second node;
second switching means responding to the input signal of said mode selecting pad, for providing a conducting channel between said second voltage supplying terminal and a third node and a complement of said intermediate signal at said third node; and
an insulating gate field effect transistor having a channel connected between said mode selecting pad and said second voltage supplying terminal, and a gate connected with said third node.

5. A circuit of claim 4, wherein said mode selecting pad is selectively connectable to receive said source supply to select an operational mode.

6. A circuit of claim 4, further comprising:
latching means connected between said second and third nodes, for latching a voltage state in dependence upon switching of said first switching means and said second switching means.

7. A circuit of claim 6, wherein said latching means comprises a pair of CMOS inverting gates having input and output terminals cross-connected with each other.

8. A mode selecting circuit, comprising:
means for receiving a first potential, said first potential delayed by an interval, and a second potential; and
a plurality of means for generating control pulses, each of said generating means including:
switching means having a control junction, for providing a conduction channel between a first node and said second potential;
mode selection means for controlling conduction of said conduction channel via said control junction in response to a mode selection signal;
means coupled between said receiving means and said first node, for latching a voltage state at said first node in response to said first potential delayed by an interval and conduction by said conduction channel; and
second controlling means connectable between said control junction and said second potential, for controlling said conduction of said conduction channel via said control junction in response to signals at said first node.

9. The mode selecting circuit of claim 8, wherein said second controlling means comprises an insulating gate field effect device having a conduction channel connectable between said control junction and said second potential.

10. The mode selecting circuit of claim 8, wherein said latching means comprises:
first and second transistors connectable between said first and second potentials with serially coupled conduction channels providing a second node and control electrodes coupled to said first node; and
third and fourth semiconductor devices connectable between said first and second potentials with serially coupled conduction channels providing said first node, and control electrodes coupled to said second node.

11. The mode selecting circuit of claim 8, wherein said latching means comprises:
first and second semiconductor devices connectable between said first and second potentials with serially coupled conduction channels providing a second node, and control electrodes coupled to said receiving means for receiving said first potential delayed by an interval;
third and fourth transistors connectable between said first and second potentials with serially coupled conduction channels providing a third node and control electrodes coupled to said first node; and
fifth and sixth semiconductor devices connectable between said first and second potentials with serially coupled conduction channels providing said first node, and control electrodes coupled to said third node; and
a seventh semiconductor device having a control electrode coupled to said second node and a conduction channel connectable between said second potential and said third node.

12. The mode selecting circuit of claim 8, further comprised of means for inverting a logic state of a signal occurring at said first node, connectable between said first node and an output terminal.

13. The mode selecting circuit of claim 8, further comprised of:
means for inverting a logic state of a signal occurring on said first node, connectable between said first node and an output terminal;
wherein said latching means comprises:
first and second semiconductor devices connectable between said first and second potentials with serially coupled conduction channels providing a second node, and control electrodes coupled to said receiving means for receiving said first potential delayed by an interval;
third and fourth transistors connectable between said first and second potentials with serially coupled conduction channels providing a third node and control electrodes coupled to said first node;

fifth and sixth semiconductor devices connectable between said first and second potentials with serially coupled conduction channels providing said first node, and control electrodes coupled to said third node; and a seventh semiconductor device having a control electrode coupled to said second node and a conduction channel connectable between said second potential and said third node.

14. The mode selecting circuit of claim 13, wherein said second controlling means comprises an insulating gate field effect device having a conduction channel connectable between said control junction and said second potential.

15. The mode selecting circuit of claim 8, wherein:
said first potential and said first potential delayed by said interval comprise input signals exhibiting a difference in phase during said interval; and
said mode selection means selectively applies said first potential to said control junction of said switching means.

16. The mode selecting circuit of claim 13, wherein:
said first potential and said first potential delayed by said interval comprise input signals exhibiting a difference in phase during said interval; and
said mode selection means selectively applies said first potential to said control junction of said switching means.

17. The mode selecting circuit of claim 11, wherein said latching means is coupled between said receiving means and said first node to control the logic state of said first node during said interval according to a ratio of potential differences between said first and third nodes.

18. The mode selecting circuit of claim 13, wherein said latching means is coupled between said receiving means and said first node to control the logic state of said first node during said interval according to a ratio of potential differences between said first and third nodes.

19. The mode selecting circuit of claim 16, wherein said latching means is coupled between said receiving means and said first node to control the logic state of said first node during said interval according to a ratio of potential differences between said first and third nodes.

20. A mode selecting circuit, comprising:
means for receiving a first input signal and a second input signal, said first and second input signals having amplitudes differing in phase by an interval of time;
first switching means having a first control junction, for providing a first conduction channel between a first node and a reference potential;
second switching means having a second control junction, for providing a second conduction channel between a second node and said reference potential;
first control means, for controlling electrical conduction through said first conduction channel by applying said first input signal to said first control junction during a first mode of operation;
second control means, for controlling electrical conduction through said second conduction channel by applying said first input signal to said second conduction channel during a second mode of operation;
first latching means coupled between said receiving means and said first switching means, for controlling logic states of said first node during said interval; and
second latching means coupled between said receiving means and said second switching means, for controlling logic states of said second node during said interval.

* * * * *